(12) United States Patent
Wu et al.

(10) Patent No.: US 12,424,592 B2
(45) Date of Patent: Sep. 23, 2025

(54) MICRO LIGHT-EMITTING DISPLAY DEVICE

(71) Applicant: PlayNitride Display Co., Ltd., MiaoLi County (TW)

(72) Inventors: Bo-Wei Wu, MiaoLi County (TW); Hsiang-Wen Tang, MiaoLi County (TW); Yu-Yun Lo, MiaoLi County (TW); Shiang-Ning Yang, MiaoLi County (TW); Chang-Feng Tsai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 451 days.

(21) Appl. No.: 17/577,387

(22) Filed: Jan. 18, 2022

(65) Prior Publication Data

US 2023/0027804 A1    Jan. 26, 2023

(30) Foreign Application Priority Data

Jul. 22, 2021   (TW) ................................ 110126889

(51) Int. Cl.
| | |
|---|---|
| H01L 25/075 | (2006.01) |
| H10H 20/814 | (2025.01) |
| H10H 29/14 | (2025.01) |

(52) U.S. Cl.
CPC ....... *H01L 25/0753* (2013.01); *H10H 20/814* (2025.01); *H10H 29/142* (2025.01)

(58) Field of Classification Search
None
See application file for complete search history.

(56) References Cited

U.S. PATENT DOCUMENTS

| | | | |
|---|---|---|---|
| 2015/0097837 A1* | 4/2015 | Jepsen | G06F 3/1446 345/428 |
| 2016/0093244 A1* | 3/2016 | Kazmierski | G06F 3/1446 345/1.3 |

(Continued)

FOREIGN PATENT DOCUMENTS

| | | |
|---|---|---|
| CN | 111105720 | 5/2020 |
| CN | 111293110 | 6/2020 |

(Continued)

OTHER PUBLICATIONS

"Office Action of Taiwan Counterpart Application", issued on Jul. 26, 2022, p. 1-p. 4.

(Continued)

*Primary Examiner* — Khaja Ahmad
(74) *Attorney, Agent, or Firm* — JCIPRNET (57) ABSTRACT

A micro light-emitting display device having multiple display regions is provided. The micro light-emitting display device includes a substrate, multiple micro light-emitting elements, and multiple first light-emitting auxiliary structures. The micro light-emitting elements are disposed on the substrate, and positions of the micro light-emitting elements define ranges of the display regions. The micro light-emitting elements have a same first pitch between each other in any one of the display regions. The micro light-emitting elements have a second pitch between each other at a boundary across any two adjacent display regions. The first pitch is different from the second pitch. The light-emitting auxiliary structures are respectively disposed on the micro light-emitting elements. The light-emitting auxiliary structures have a same third pitch between each other.

14 Claims, 8 Drawing Sheets

(56) References Cited

U.S. PATENT DOCUMENTS

| | | |
|---|---|---|
| 2016/0365406 A1 | 12/2016 | Adachi et al. |
| 2017/0345802 A1 | 11/2017 | Sung et al. |
| 2018/0197461 A1* | 7/2018 | Lai ................. G09G 3/32 |
| 2018/0198020 A1* | 7/2018 | Lai .................. H01L 27/1259 |
| 2019/0043940 A1* | 2/2019 | Lee ................... H10H 29/142 |
| 2019/0131344 A1 | 5/2019 | Li et al. |
| 2020/0185360 A1 | 6/2020 | Sun et al. |
| 2020/0395348 A1* | 12/2020 | Kwag ................. H10H 20/851 |
| 2021/0005583 A1* | 1/2021 | Iguchi ................. H10K 59/90 |
| 2021/0043617 A1* | 2/2021 | Onuma .............. H01L 25/0753 |
| 2021/0091257 A1* | 3/2021 | Hwang .............. H10H 20/8515 |
| 2021/0150947 A1 | 5/2021 | Ting et al. |
| 2023/0140130 A1* | 5/2023 | Chen ................. H01L 25/0753 257/88 |

FOREIGN PATENT DOCUMENTS

| | | |
|---|---|---|
| CN | 111864029 | 10/2020 |
| CN | 112530926 | 3/2021 |
| CN | 112652642 | 4/2021 |
| CN | 213124478 | 5/2021 |
| CN | 112908188 | 6/2021 |
| JP | 2006163325 | 6/2006 |
| TW | 201941416 | 10/2019 |
| TW | 202010120 | 3/2020 |
| TW | 202044577 | 12/2020 |
| WO | 2021102810 | 6/2021 |

OTHER PUBLICATIONS

"Office Action of China Counterpart Application", issued on Nov. 24, 2022, p. 1-p. 7.
"Notice of allowance of China Counterpart Application", issued on May 23, 2023, p. 1-p. 4.

* cited by examiner

MICRO LIGHT-EMITTING DISPLAY DEVICE

CROSS-REFERENCE TO RELATED APPLICATION

This application claims the priority benefit of Taiwanese application serial no. 110126889, filed on Jul. 22, 2021. The entirety of the above-mentioned patent application is hereby incorporated by reference herein and made a part of this specification.

BACKGROUND

Technical Field

This disclosure relates to a micro light-emitting display device.

Description of Related Art

The current mass transfer technology for display devices formed by micro light-emitting diode (micro LED) cannot be made over a large area at a time on the display region, but is made by multiple transfers over a small area to splice the display devices. However, the multiple transfers also causes the display device to be prone to splicing lines after lighting up. The phenomenon may come from chip shift or brightness difference between different display regions and cause shift between groups, which may easily produce splicing lines.

SUMMARY

The disclosure provides a micro light-emitting display device capable of reducing a phenomenon of splicing lines.

An embodiment of the disclosure provides a micro light-emitting display device having multiple display regions. The micro light-emitting display device includes a substrate, multiple micro light-emitting elements, and multiple first light-emitting auxiliary structures. The micro light-emitting elements are disposed on the substrate, and positions of the micro light-emitting elements define ranges of the display regions. The micro light-emitting elements have a same first pitch between each other in any one of the display regions. The micro light-emitting elements have a second pitch between each other at a boundary across any two adjacent display regions. The first pitch is different from the second pitch. The first light-emitting auxiliary structures are respectively disposed on the micro light-emitting elements. The first light-emitting auxiliary structures have a same third pitch between each other.

An embodiment of the disclosure provides a micro light-emitting display device having multiple display regions. The micro light-emitting display device includes a substrate, multiple micro light-emitting elements, and multiple light-emitting auxiliary structures. The micro light-emitting elements are disposed on the substrate, and positions of the micro light-emitting elements define ranges of the display regions, the micro light-emitting elements have a same first pitch between each other in any one of the display regions, and the micro light-emitting elements have a second pitch between each other at a boundary across any two adjacent display regions. The first pitch is different from the second pitch. The light-emitting auxiliary structures are respectively disposed on the micro light-emitting elements. The light-emitting auxiliary structures are reflective layers or absorbing layers, and each of the light-emitting auxiliary structures has an opening. Areas of the openings of the light-emitting auxiliary structures gradually increase or decrease at the boundary across the any two adjacent display regions.

Based on the above, in the micro light-emitting display device according to an embodiment of the disclosure, since the light-emitting auxiliary structures have the same pitch between each other, effective area of light-emitting is redefined, and therefore the phenomenon of splicing lines between the display regions is mitigated.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
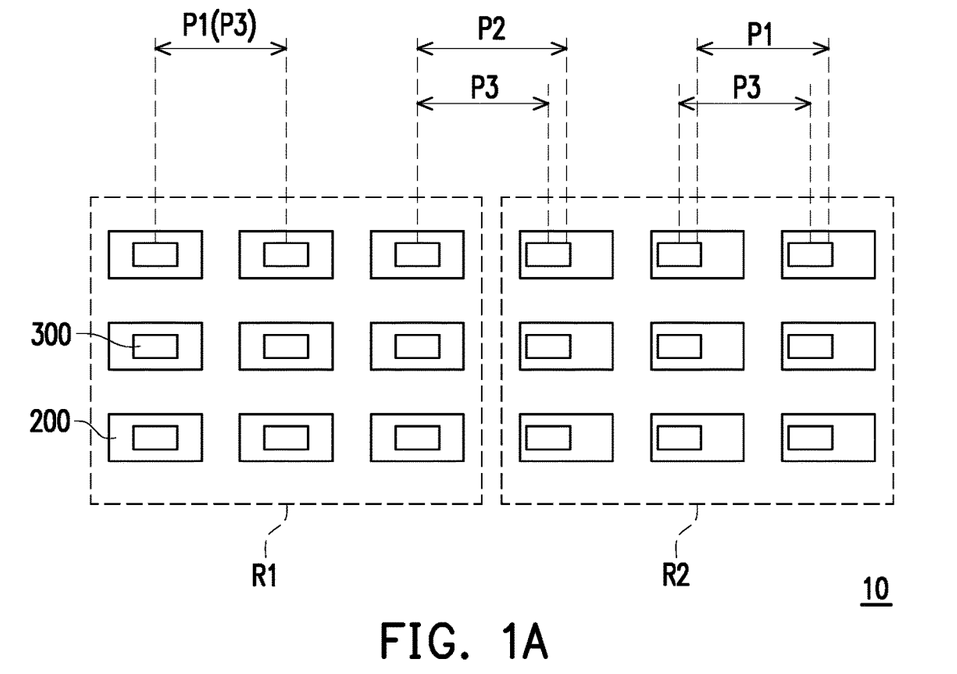
FIG. 1A is a schematic top view of a micro light-emitting display device according to a first embodiment of the disclosure.
Figure 1B:
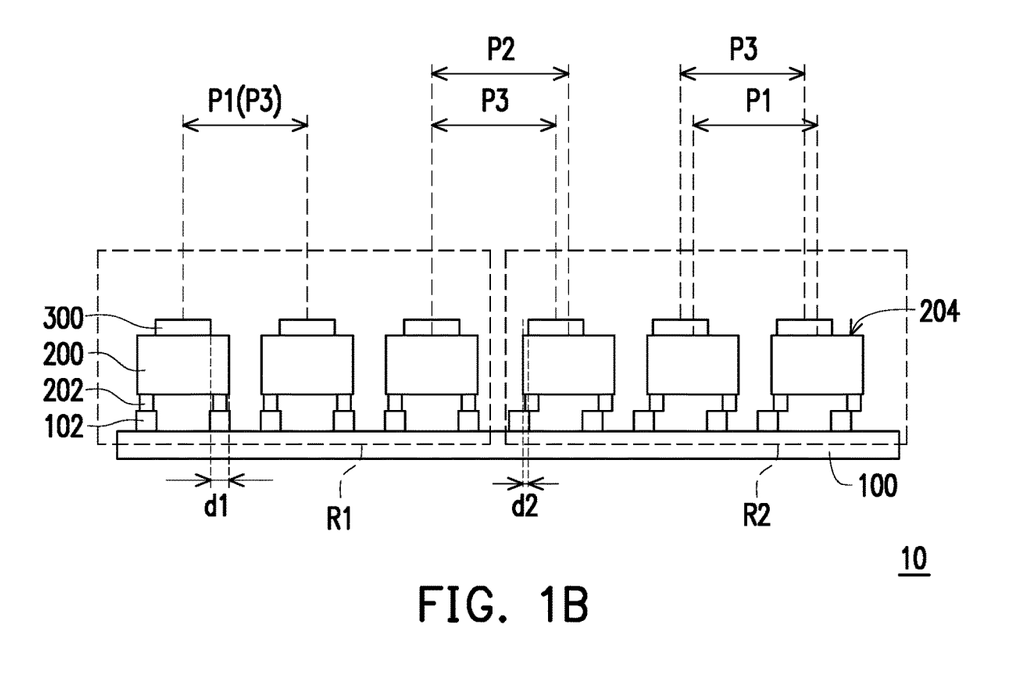
FIG. 1B is a schematic side view of the micro light-emitting display device of FIG. 1A.

FIG. 1A is a schematic top view of a micro light-emitting display device according to a first embodiment of the disclosure. FIG. 1B is a schematic side view of the micro light-emitting display device of FIG. 1A. For the convenience of illustration, the drawings in the specification simply show two display regions R1 and R2, but the number of the display regions R1 and R2 that a micro light-emitting display device 10 may have should be determined by actual production conditions. Moreover, the number of a micro light-emitting element 200 in each of the display regions R1 and R2 is simply shown as 3 ×3. For example, an area of the each of the display regions R1 and R2 falls in the range of approximately 20×20 to 30×30 mm². Therefore, an order of magnitude of the number of the micro light-emitting element 200 in the display regions R1 and R2 is greater than $10^3$.

Referring FIG. 1A and FIG. 1B at the same time. An embodiment of the disclosure provides a micro light-emitting display device 10 having multiple display regions R1 and R2. The micro light-emitting display device 10 includes a substrate 100, multiple micro light-emitting elements 200, and multiple first light-emitting auxiliary structures 300. The substrate 100 is, for example, a thin-film transistor (TFT) substrate, a printed circuit board (PCB), a flexible printed circuit (FPC) board, or other types of circuit substrates. The micro light-emitting element 200 may be micro light-emitting diode (Micro LED), mini light-emitting diode (Mini LED) or other types of micro light-emitting elements. The micro light-emitting element 200 is electrically connected to the substrate 100 by a connection between a bonding pad 202 of the micro light-emitting element 200 and a bonding pad 102 of the substrate 100.

According to this embodiment, the micro light-emitting elements 200 are disposed on the substrate 100, and positions of the micro light-emitting elements 200 define ranges of the display regions R1 and R2. In detail, the micro light-emitting elements 200 have a same first pitch P1 between each other in any one of the display regions R1 and R2. However, the micro light-emitting elements 200 have a second pitch P2 between each other at a boundary across any two adjacent display regions R1 and R2. The first pitch P1 is different from the second pitch P2. Therefore, a distribution of the micro light-emitting elements 200 visually has a phenomenon of splicing lines at a junction between the display regions R1 and R2.

In order to solve the phenomenon of splicing lines, according to this embodiment, the first light-emitting auxiliary structures 300 are respectively disposed on the micro light-emitting elements 200. The first light-emitting auxiliary structures 300 have a same third pitch P3 between each other. The first light-emitting auxiliary structure 300 is configured so that the first pitch P1 is the same as the third pitch P3. That is, as shown in the top view of FIG. 1A, the first light-emitting auxiliary structures 300 have the same pitch between each other, thus reducing the phenomenon of splicing lines at the junction between the display regions R1 and R2.

According to this embodiment, the third pitch P3 is less than or equal to 1 µm. According to one embodiment, the third pitch P3 is less than or equal to 500 µm for a better display.

According to this embodiment, the first light-emitting auxiliary structures 300 may be light-guide structures, and refractive index of the first light-emitting auxiliary structures 300 is greater than 1 and less than refractive index of the micro light-emitting elements 200. This refractive index difference helps to improve light-emitting efficiency of each of the micro light-emitting elements 200. The light-guide structures may be inorganic materials, such as silicon dioxide or silicon nitride, in addition to increasing a light-guide effect, may also withstand high temperature and pressure in a process to protect a surface of the micro light-emitting elements 200. The first light-emitting auxiliary structures 300 account for at least 0.5 of a surface 204 of the micro light-emitting elements, which may have better light-guide efficiency.

In addition, according to this embodiment, in the any two adjacent display regions R1 and R2, minimum distances d1 and d2 between edges of the first light-emitting auxiliary structures 300 and edges of the micro light-emitting elements 200 are different from each other, and a light-emitting light pattern may be controlled.

Based on the above, in the micro light-emitting display device 10 according to an embodiment of the disclosure, since the micro light-emitting elements 200 are provided with the light-emitting auxiliary structures 300 thereon, and the light-emitting auxiliary structures 300 have the same pitch between each other, effective area of light emission is redefined, and therefore the phenomenon of splicing lines between the display regions R1 and R2 is mitigated.

Figure 2:
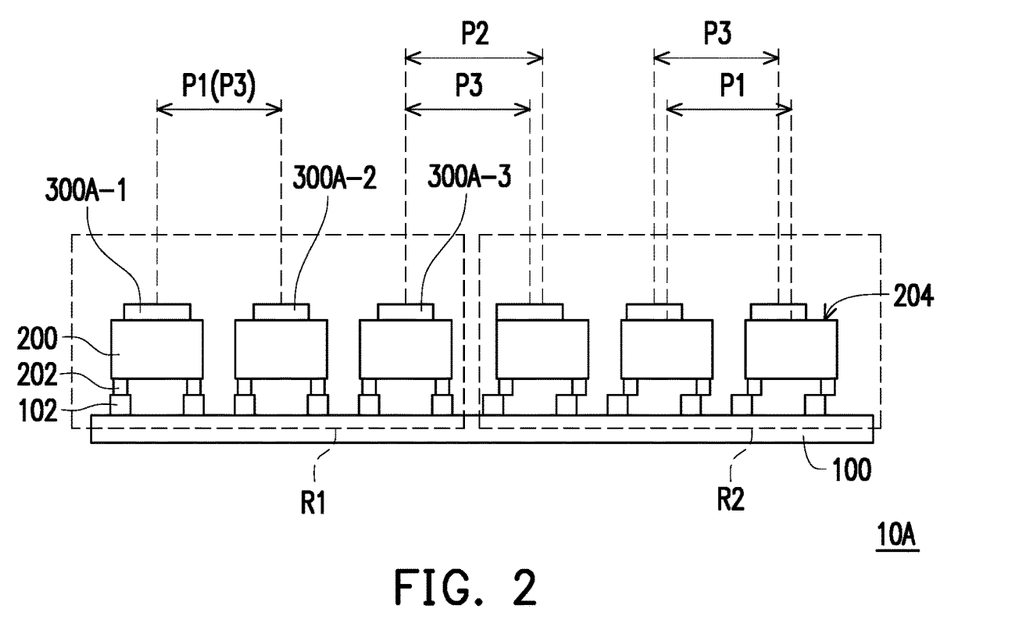
FIG. 2 is a schematic side view of a micro light-emitting display device according to a second embodiment of the disclosure.

FIG. 2 is a schematic side view of a micro light-emitting display device according to a second embodiment of the disclosure. Referring to FIG. 2, a micro light-emitting display device 10A is substantially the same as the micro light-emitting display device 10 of FIG. 1B, and main differences are as follows. According to this embodiment, first light-emitting auxiliary structures 300A-1, 300A-2, and 300A-3 have multiple different areas. FIG. 2 shows that the area of the light-emitting auxiliary structure 300A-1 is larger than the area of the light-emitting auxiliary structure 300A-2, 300A-3, and the area of the light-emitting auxiliary structure 300A-2 is equal to the area of the light-emitting auxiliary structure 300A-3. For example, the light-emitting auxiliary structures 300A-1, 300A-2, and 300A-3 are respectively disposed on red, green, and blue micro light-emitting elements 200. Generally speaking, light-emitting efficiency of red light-emitting diodes is lower than light-emitting efficiency of green light-emitting diodes and blue light-emitting diodes. Therefore, the first light-emitting auxiliary structures 300A-1, 300A-2, and 300A-3 are designed to have multiple different areas. For example, the light-emitting auxiliary structure 300A-1 corresponding to the red light-emitting device 200 is larger than the first light-emitting auxiliary structures 300A-2 and 300A-3 corresponding to the green light-emitting device 200 and the blue light-emitting device 200, which helps to make brightness of each color light of the micro light-emitting display device 10A more consistent.

Figure 3A:
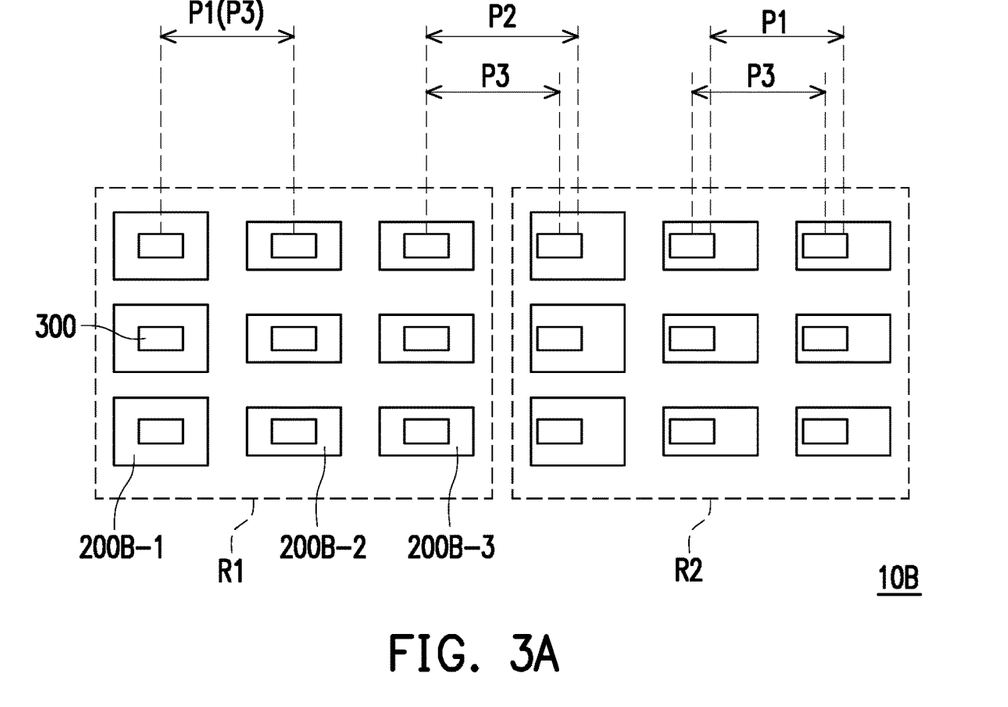
FIG. 3A is a schematic top view of a micro light-emitting display device according to a third embodiment of the disclosure.
Figure 3B:
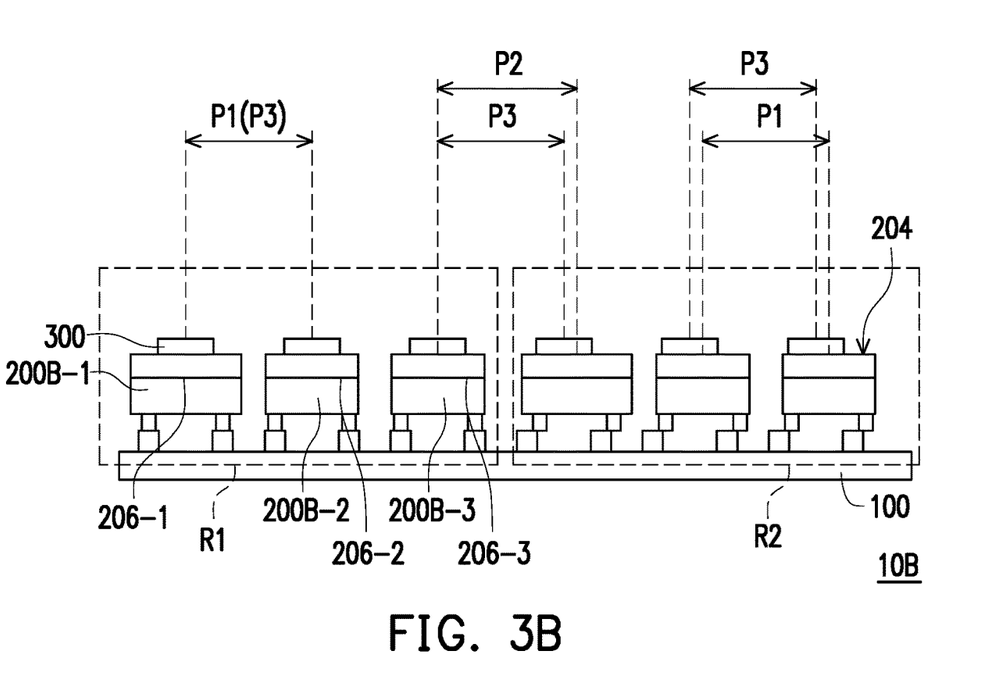
FIG. 3B is a schematic side view of the micro light-emitting display device according to the third embodiment of the disclosure.

FIG. 3A is a schematic top view of a micro light-emitting display device according to a third embodiment of the disclosure. FIG. 3B is a schematic side view of the micro light-emitting display device according to the third embodiment of the disclosure. Referring to FIG. 3A and FIG. 3B, a micro light-emitting display device 10B is substantially the same as the micro light-emitting display device 10 of FIG. 1B, and main differences are as follows. According to this embodiment, micro light-emitting elements 200B-1, 200B-2, and 200B-3 have multiple different light-emitting areas, but each corresponding light-emitting auxiliary structures 300 has the same area. FIG. 3B shows that a size of the micro light-emitting element 200B-1 is larger than a size of the micro light-emitting element 200B-2, 200B-3, and the size of the micro light-emitting element 200B-2 is equal to the size of the micro light-emitting element 200B-3. For example, the micro light-emitting elements 200B-1, 200B-2, and 200B-3 may be red, green, and blue light-emitting diodes, respectively, or light-emitting diodes of the same light color. The sizes of the micro light-emitting elements are different due to manufacturing process, and the sizes of the micro light-emitting elements reflect area sizes of light-emitting layers 206-1, 206-2 and 206-3. Therefore, the light-emitting auxiliary structures 300 on the micro light-emitting elements 200B-1, 200B-2, 200B-3 with different light-emitting areas are designed to have the same area, which helps to make brightness of each color light of the micro light-emitting display device 10B more consistent, and it is possible to increase an utilization rate of chips by eliminating the need to binning the light-emitting elements first.

Figure 4A:
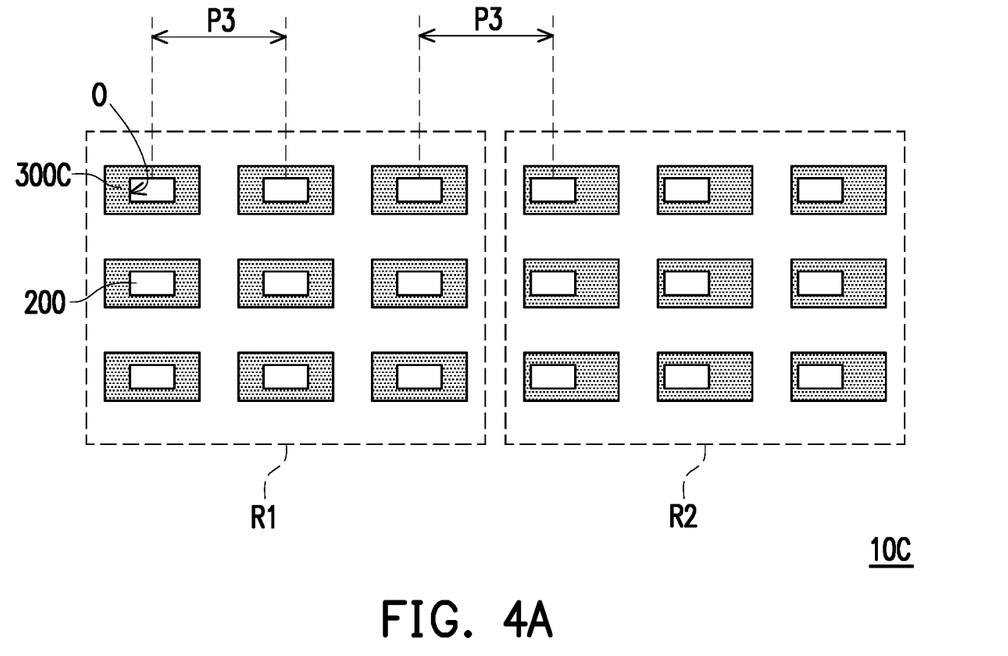
FIG. 4A is a schematic top view of a micro light-emitting display device according to a fourth embodiment of the disclosure.
Figure 4B:
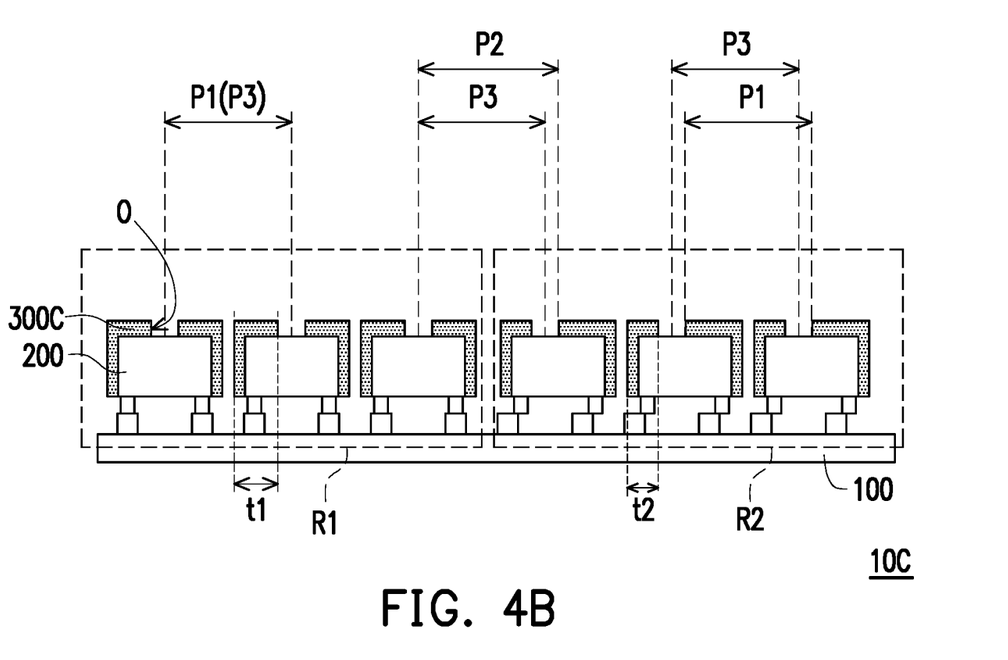
FIG. 4B is a schematic side view of the micro light-emitting display device of FIG. 4A.

FIG. 4A is a schematic top view of a micro light-emitting display device according to a fourth embodiment of the disclosure. FIG. 4B is a schematic side view of the micro light-emitting display device of FIG. 4A. Referring FIG. 4A and FIG. 4B at the same time, a micro light-emitting display device 10C is substantially the same as the micro light-emitting display device 10 of FIG. 1B, and main differences are as follows. According to this embodiment, first light-emitting auxiliary structures 300C are reflective layers or absorbing layers, and each of first light-emitting auxiliary structures 300C has an opening O. The openings O of the first light-emitting auxiliary structures 300C have a same third pitch P3 between each other. The first light-emitting auxiliary structures 300C may be organic materials with high absorptivity, such as a black photoresist, or a metal material with high reflectivity. The openings O account for at least greater than or equal to 0.5 of a surface 204 of the micro light-emitting elements 200, which may have better light-guide efficiency.

According to this embodiment, more specifically, projection of the micro light-emitting elements 200 on the substrate 100 completely covers projection of the openings O of the first light-emitting auxiliary structures 300C on the substrate 100, i.e., the opening O is smaller than a light-emitting surface of the micro light emitting element 200, and the light-emitting light pattern may be controlled.

In addition, according to this embodiment, in the any two adjacent display regions R1 and R2, minimum thicknesses t1 and t2 between edges of the first light-emitting auxiliary structures 300 and the openings O thereof are different from each other, and design of the openings O may be controlled.

Based on the above, in the micro light-emitting display device 10C according to the embodiment of the disclosure, the first light-emitting auxiliary structures 300C are designed as reflective layers or absorbing layers, and positions of the openings O are adjusted so that a light-emitting position of the each of the micro light-emitting elements 200 are consistent. Therefore, by adjusting display areas, the phenomenon of splicing lines between the adjacent display regions R1 and R2 of the micro light-emitting display device 10C is mitigated.

Figure 5:
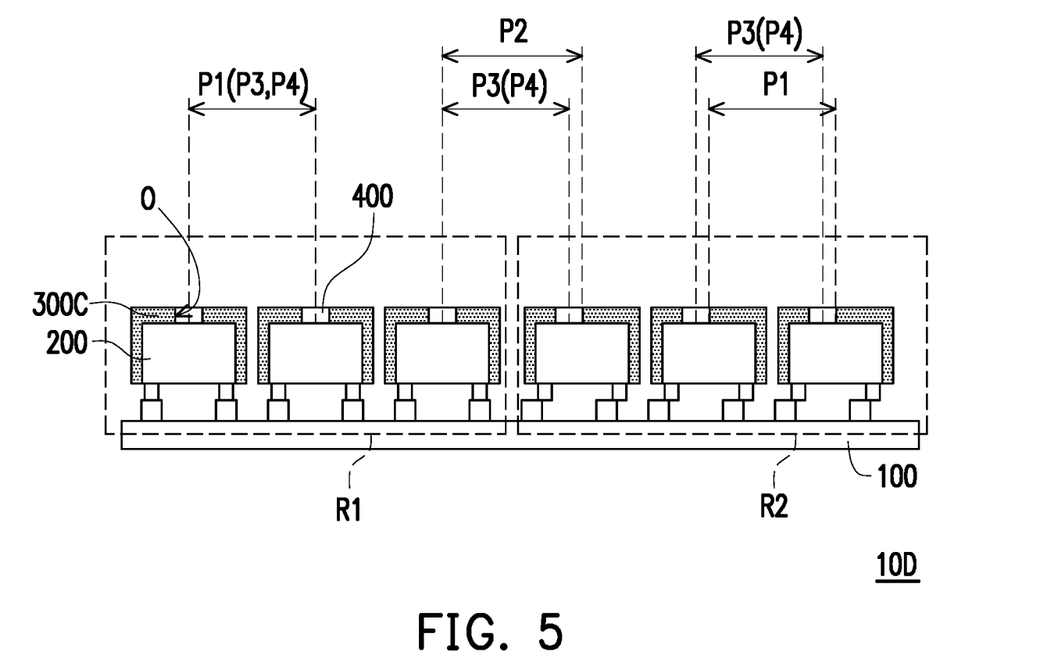
FIG. 5 is a schematic side view of a micro light-emitting display device according to a fifth embodiment of the disclosure.

FIG. 5 is a schematic side view of a micro light-emitting display device according to a fifth embodiment of the disclosure. Referring to FIG. 5, a micro light-emitting display device 10D is substantially the same as the micro light-emitting display device 10C of FIG. 4B, and main differences are as follows. According to this embodiment, the micro light-emitting display device 10D further includes multiple second light-emitting auxiliary structures 400. The second light-emitting auxiliary structures 400 are respectively disposed in the openings O of the first light-emitting auxiliary structures 300C. The second light-emitting auxiliary structures 400 have a same fourth pitch P4 between each other, and the fourth pitch P4 is the same as the third pitch P3.

According to this embodiment, the second light-emitting auxiliary structures 400 are light-guide structures, and refractive index of the second light-emitting auxiliary structures 400 is greater than 1 and less than the refractive index of the micro light-emitting elements 200.

According to this embodiment, projection of the second light-emitting auxiliary structure 400 on the substrate 100 and the projection of the micro light-emitting element 200 on the substrate 100 overlap with each other. More specifically, the projection of the micro light-emitting element 200 on the substrate 100 completely covers the projection of the second light-emitting auxiliary structure 400 on the substrate 100, i.e., the second light-emitting auxiliary structure 400 is smaller than the light-emitting surface of the micro light-emitting element 200.

Based on the above, in the micro light-emitting display device 10D according to the embodiment of the disclosure, in addition to adjusting the positions of the openings O of the first light-emitting auxiliary structures 300C to make the light-emitting position of the each of the micro light-emitting elements 200 consistent, the second light-emitting auxiliary structures 400 are further disposed in the openings O. Therefore, the micro light-emitting display device 10D may not only reduce brightness to mitigate the phenomenon of splicing lines between the adjacent display regions R1 and R2, but also use the second light-emitting auxiliary structures 400 to improve the light-emitting efficiency of the micro light-emitting display device 10D.

Figure 6:
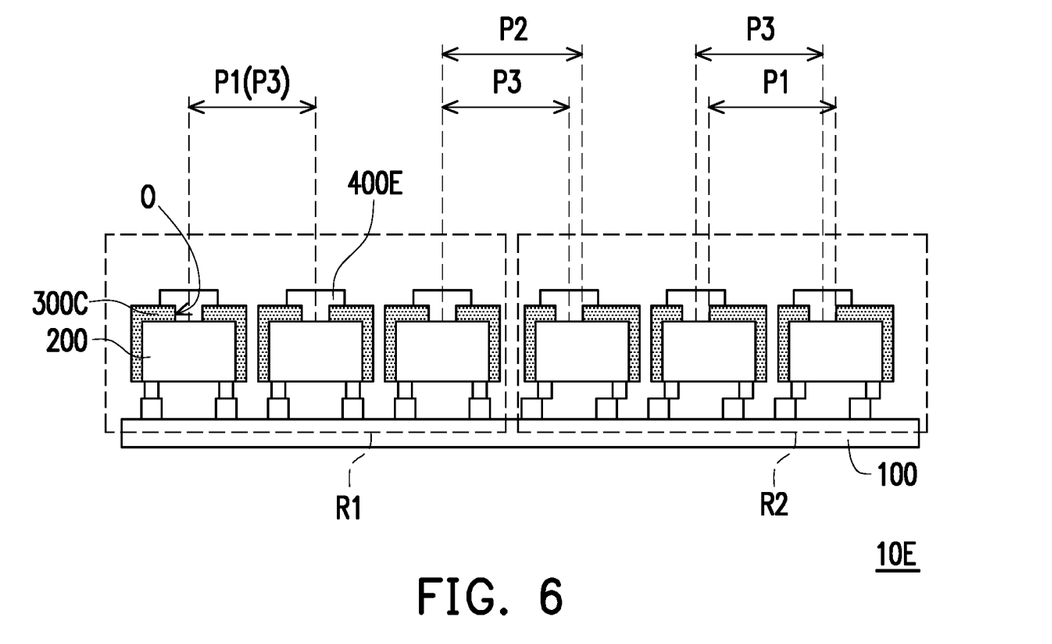
FIG. 6 is a schematic side view of a micro light-emitting display device according to a sixth embodiment of the disclosure.
Figure 7A:
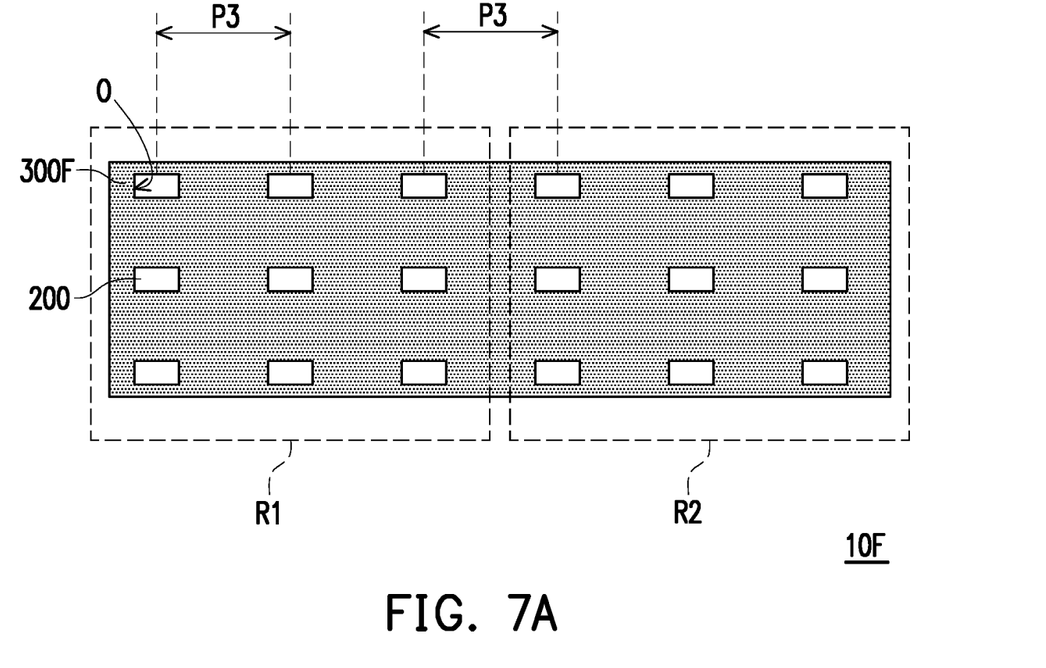
FIG. 7A is a schematic top view of a micro light-emitting display device according to a seventh embodiment of the disclosure.
Figure 7B:
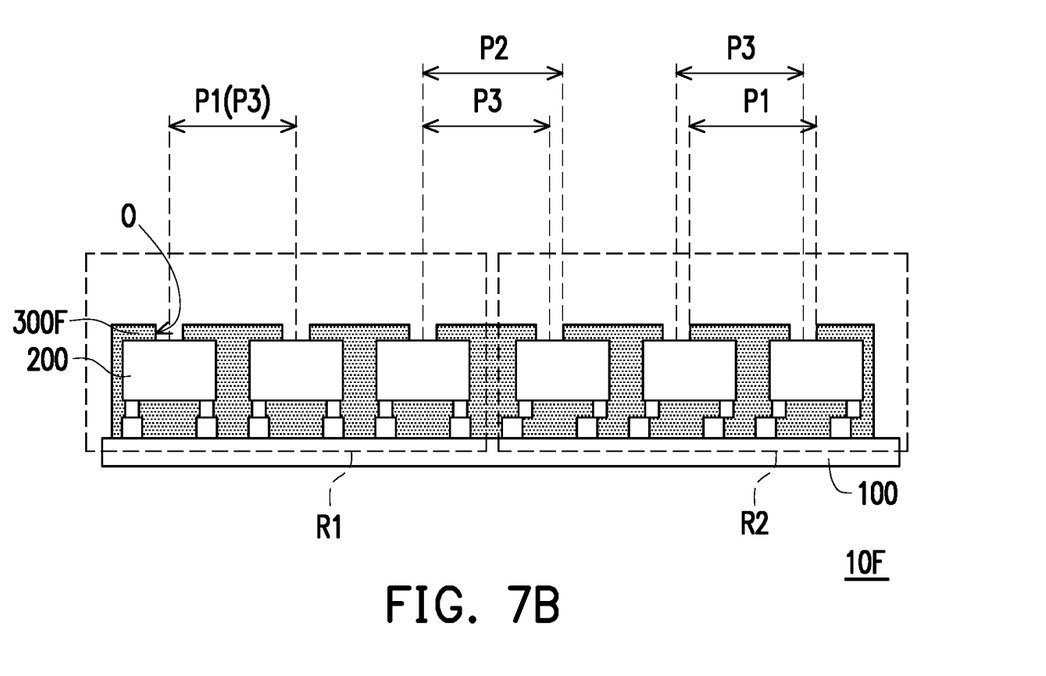
FIG. 7B is a schematic side view of the micro light-emitting display device of FIG. 7A.

FIG. 6 is a schematic side view of a micro light-emitting display device according to a sixth embodiment of the disclosure. Referring FIG. 6, a micro light-emitting display device 10E is substantially the same as the micro light-emitting display device 10D of FIG. 5, and main differences are as follows. According to this embodiment, a portion of second light-emitting auxiliary structures 400E is extended and disposed on surfaces of the first light-emitting auxiliary structures 300C opposite to the micro light-emitting elements 200. Here, projection of the second light-emitting auxiliary structures 400E on the surface of the micro light-emitting elements 200 is greater than projection of the openings O on the surface of the micro light-emitting elements 200, and the projections of the second light-emitting auxiliary structures 400E on the surface of the micro light-emitting elements 200 are the same, so as to increase the light-emitting efficiency and consistent display effect. Advantages of the micro light-emitting display device 10E are similar to advantages of the micro light-emitting display device 10D, and therefore will not be repeated in the following FIG. 7A is a schematic top view of a micro light-emitting display device according to a seventh embodiment of the disclosure. FIG. 7B is a schematic side view of the micro light-emitting display device of FIG. 7A. Referring to FIG. 7A and FIG. 7B at the same time, a micro light-emitting display device 10F is substantially the same as the micro light-emitting display device 10C of FIG. 4B, and main differences are as follows. According to this embodiment, first light-emitting auxiliary structures 300F are connected to each other, and the first light-emitting auxiliary structures 300F are disposed in space between the micro light-emitting elements 200. Here, the first light-emitting auxiliary structures 300F fill the space between the micro light-emitting elements 200, so that splicing lines between the display regions R1 and R2 are covered, further reducing the phenomenon of splicing lines in the micro light-emitting display device 10F and increasing a contrast ratio by a high black ratio. According to an embodiment not shown, the first light-emitting auxiliary structures 300F may also fill only space between the display region R1 and R2.

Figure 8A:
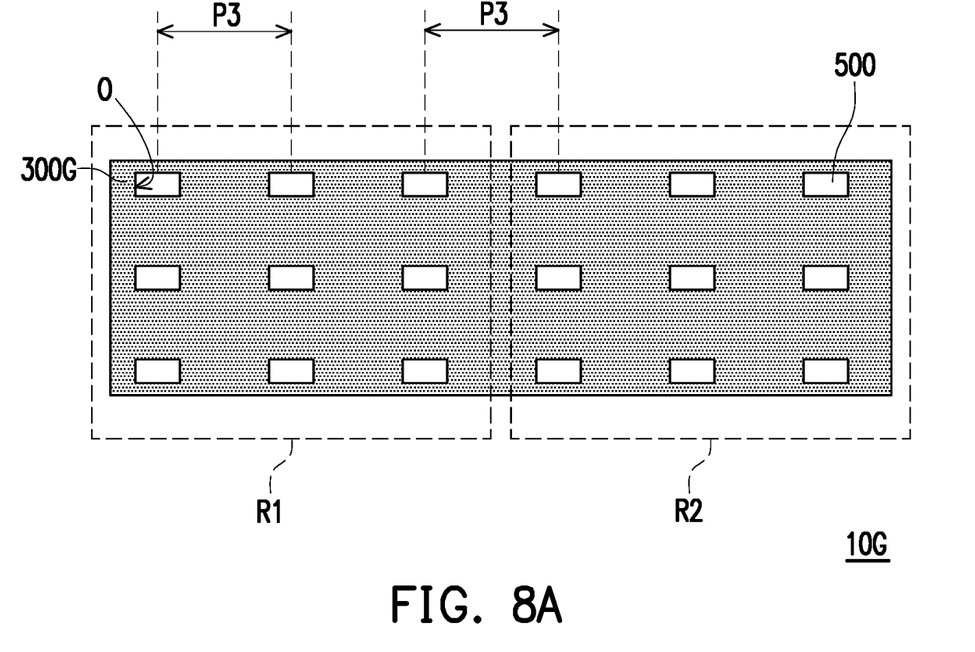
FIG. 8A is a schematic top view of a micro light-emitting display device according to an eighth embodiment of the disclosure.
Figure 8B:
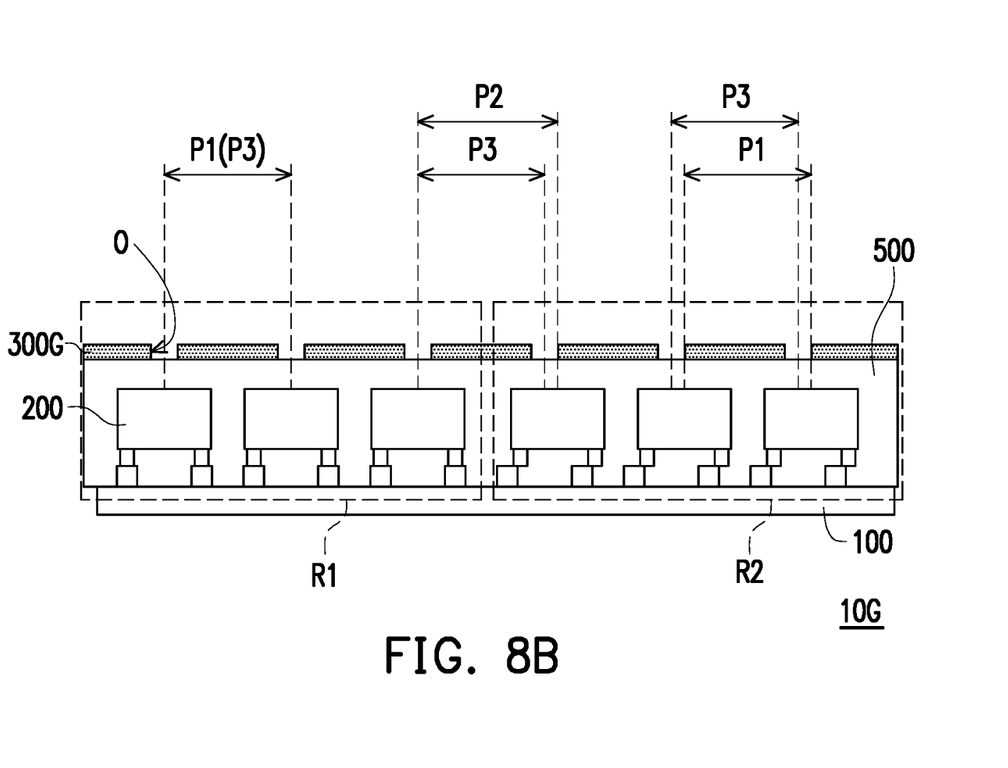
FIG. 8B is a schematic side view of the micro light-emitting display device of FIG. 8A.

FIG. 8A is a schematic top view of a micro light-emitting display device according to an eighth embodiment of the disclosure. FIG. 8B is a schematic side view of the micro light-emitting display device of FIG. 8A. Referring FIG. 8A and FIG. 8B at the same time, a micro light-emitting display device 10G is substantially the same as the micro light-emitting display device 10C of FIG. 4B, and main differences are as follows. According to this embodiment, the micro light-emitting display device 10G further includes a light-transmitting layer 500. The light-transmitting layer 500 is disposed between first light-emitting auxiliary structures 300G and the micro light-emitting elements 200, and the light-transmitting layer 500 is disposed in the space between the micro light-emitting elements 200. In other words, the light-transmitting layer 500 may be used as a protective layer of the micro light-emitting elements 200, which helps prevent water in the air from contaminating the micro light-emitting elements 200, further making the micro light-emitting display device 10G have a better yield. The light-transmitting layer 500 may be a plastic material with refractive index greater than 1 and less than the refractive index of the micro light-emitting elements 200, which allows the micro light-emitting elements 200 to have a better light-emitting effect. Here, the light-emitting auxiliary structures 300G may be reflective layers or absorbing layers, so that light is emitted through the openings O.

Figure 9:
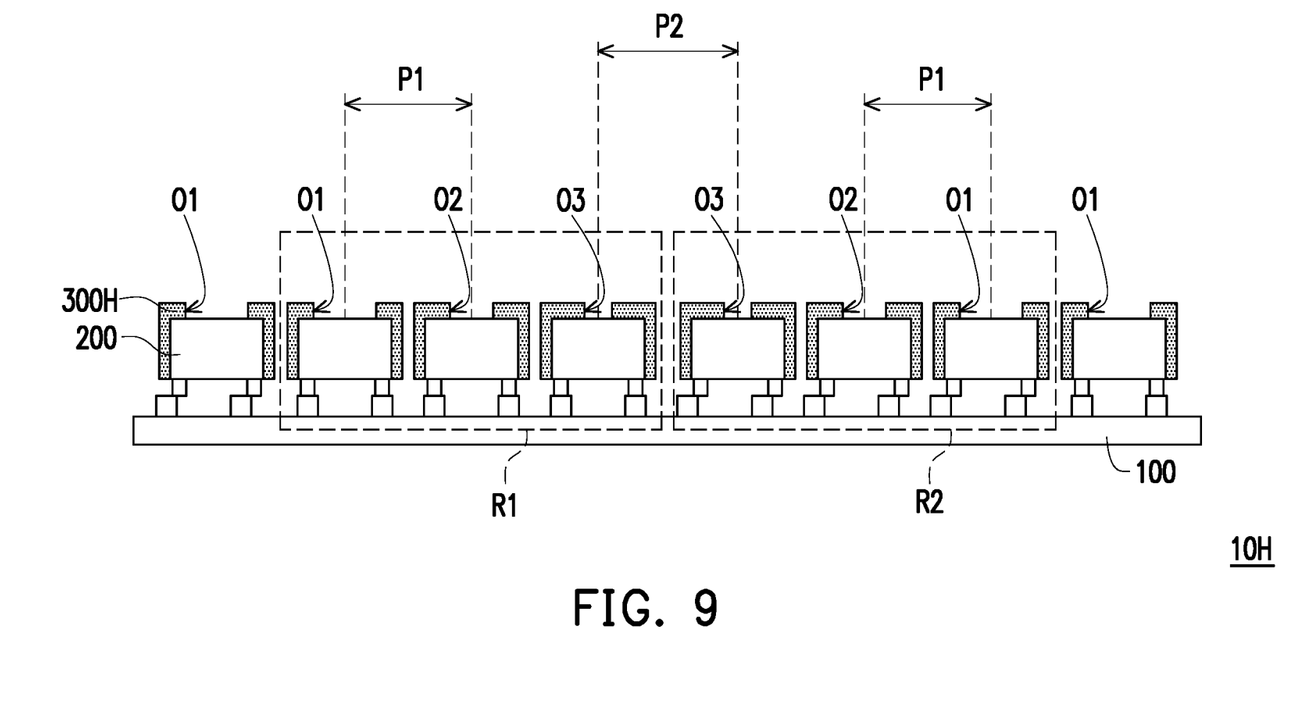
FIG. 9 is a schematic side view of a micro light-emitting display device according to a ninth embodiment of the disclosure.

FIG. 9 is a schematic side view of a micro light-emitting display device according to a ninth embodiment of the disclosure. Referring FIG. 9, a micro light-emitting display device 10H is substantially the same as the micro light-emitting display device 10C of FIG. 4B, and main differences are as follows. According to this embodiment, light-emitting auxiliary structures 300H are reflective layers or absorbing layers, and each of the light-emitting auxiliary structures 300H has openings O1, O2, and O3. Areas of the openings O1, O2, and O3 of the light-emitting auxiliary structures 300H gradually increase or decrease at the boundary across the any two adjacent display regions R1 and R2, and same openings O1, O2 or O3 has a same opening size.

In addition, if an area ratio between the openings O1, O2, and O3 is too large or too small, it will lead to a more obvious phenomenon of splicing lines. Therefore, according to this embodiment, the area ratio between the openings O1, O2 and O3 of the light-emitting auxiliary structures 300H preferably falls within a range of 0.8 to 1.2.

Based on the above, by designing the areas of the openings O1, O2, and O3 near the splicing line to gradually increase or decrease, it also helps to reduce a visual phenomenon of splicing lines at the junction between the display regions R1 and R2. Preferably, only 10% of the light-emitting auxiliary structures 300H at the boundary has an increase or gradual decrease of the openings, and the openings in a middle display region still maintain the same opening size, which may have a better display effect.

In summary, in the micro light-emitting display device according to an embodiment of the disclosure, since the light-emitting auxiliary structures have the same pitch between each other, effective area of light-emitting is redefined, and therefore the phenomenon of splicing lines between the display regions is mitigated.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro light-emitting display device having a plurality of display regions, the micro light-emitting display device comprising:
   a substrate;
   a plurality of micro light-emitting elements disposed on the substrate, wherein positions of the micro light-emitting elements define ranges of the display regions, the micro light-emitting elements have a same first pitch between each other in any one of the display regions, and the micro light-emitting elements have a second pitch between each other at a boundary across any two adjacent display regions, wherein the first pitch is different from the second pitch; and
   a plurality of first light-emitting auxiliary structures respectively disposed on the micro light-emitting elements, wherein the first light-emitting auxiliary structures have a same third pitch between each other in the any one of the display regions and at the boundary across the any two adjacent display regions,
   wherein the first pitch is a distance from a middle point of a micro light-emitting element to a corresponding middle point of an adjacent micro light-emitting element in the any one of the display regions, the second pitch is a distance from a middle point of a micro light-emitting element to a corresponding middle point of an adjacent micro light-emitting element at the boundary across the any two adjacent display regions, and the third pitch is a distance from a middle point of a first light-emitting auxiliary structure to a corresponding middle point of an adjacent first light-emitting auxiliary structure.

2. The micro light-emitting display device according to claim 1, wherein the first pitch is the same as the third pitch.

3. The micro light-emitting display device according to claim 1, wherein the first light-emitting auxiliary structures have a plurality of different areas.

4. The micro light-emitting display device according to claim 1, wherein the micro light-emitting elements have a plurality of different light-emitting areas, and the light-emitting auxiliary structures have a same area.

5. The micro light-emitting display device according to claim 1, wherein the first light-emitting auxiliary structures are light-guide structures, and refractive index of the first light-emitting auxiliary structures is greater than 1 and less than refractive index of the micro light-emitting elements.

6. The micro light-emitting display device according to claim 1, wherein in the any two adjacent display regions, minimum distances between edges of the first light-emitting auxiliary structures and edges of the micro light-emitting elements are different from each other.

7. The micro light-emitting display device according to claim 1, wherein the first light-emitting auxiliary structures are reflective layers or absorbing layers, and each of the first light-emitting auxiliary structures has an opening.

8. The micro light-emitting display device according to claim 7, wherein the openings of the first light-emitting auxiliary structures have the same third pitch between each other.

9. The micro light-emitting display device according to claim 7, wherein projection of the micro light-emitting elements on the substrate completely covers projection of the openings of the first light-emitting auxiliary structures on the substrate.

10. The micro light-emitting display device according to claim 7, wherein in the any two adjacent display regions, minimum thicknesses between edges of the first light-emitting auxiliary structures and the openings of the first light-emitting auxiliary structures are different from each other.

11. The micro light-emitting display device according to claim 7 further comprising:
a plurality of second light-emitting auxiliary structures respectively disposed in the openings of the first light-emitting auxiliary structures, wherein the second light-emitting auxiliary structures have a same fourth pitch between each other, and the fourth pitch is the same as the third pitch, and wherein the fourth pitch is a distance from a middle point of a second light-emitting auxiliary structure to a corresponding middle point of an adjacent second light-emitting auxiliary structure.

12. The micro light-emitting display device according to claim 11, wherein a portion of the second light-emitting auxiliary structures is extended and disposed on surfaces of the first light-emitting auxiliary structures opposite to the micro light-emitting elements.

13. The micro light-emitting display device according to claim 7, wherein the first light-emitting auxiliary structures are connected to each other, and the first light-emitting auxiliary structures are disposed in space between the micro light-emitting elements.

14. The micro light-emitting display device according to claim 7 further comprising:
a light-transmitting layer disposed between the first light-emitting auxiliary structures and the micro light-emitting elements, and the light-transmitting layer disposed in space between the micro light-emitting elements.

\* \* \* \* \*